United States Patent [19]
Adams et al.

[11] Patent Number: 5,483,547
[45] Date of Patent: Jan. 9, 1996

[54] SEMICONDUCTOR LASER STRUCTURE FOR IMPROVED STABILITY OF THE THRESHOLD CURRENT WITH RESPECT TO CHANGES IN THE AMBIENT TEMPERATURE

[75] Inventors: David M. Adams, Gloucester; Toshihiko Makino; George K. D. Chik, both of Nepean, all of Canada

[73] Assignee: Northern Telecom Limited, Quebec, Canada

[21] Appl. No.: 242,653

[22] Filed: May 10, 1994

[51] Int. Cl.$^6$ .................. H01L 31/0304; H01L 33/00; H01S 3/19

[52] U.S. Cl. .................. 372/45; 257/13; 257/18; 257/22; 257/97; 257/103

[58] Field of Search .................. 257/13, 18, 22, 257/97, 103; 372/45

[56] References Cited

U.S. PATENT DOCUMENTS

| | | | |
|---|---|---|---|
| 5,091,756 | 2/1992 | Iga et al. | 357/4.16 |
| 5,251,224 | 10/1993 | Irikawa | 372/45 |

FOREIGN PATENT DOCUMENTS

| | | | |
|---|---|---|---|
| 4139782 | 5/1992 | Japan | 372/45 |
| 2212325 | 7/1989 | United Kingdom | 257/13 |

OTHER PUBLICATIONS

Corzine et al. Appl. Phys. Lett. 59(5) 29 Jul. 1991 "Theoretical in wells" pp. 588–590.
"Semiconductor Quantum Wells as Electron Wave Slab Waveguides", Gaylord et al., J. Appl. Phys. 66(4), Aug. 15, 1989, pp. 1842–1848.
"Semiconductor Electron–Wave Slab Waveguides", Gaylord et al., J. Appl. Phys. 66(3), Aug. 1, 1989, pp. 1483–1485.
"Carrier Dynamics and Recombination Mechanisms in Staggered–Alignment Heterostructures", IEEE Journal of Quantum Electronics, vol. 24, No. 8, Aug. 1988, pp. 1763–1777.

Primary Examiner—Jerome Jackson
Attorney, Agent, or Firm—George MacGregor

[57] ABSTRACT

A Type II heterojunction formed of semiconductor material which normally forms a Type I heterojunction. The Type II heterojunction is created by using a carefully chosen stack of epitaxial semiconductor materials with modifications to the band structure through quantum mechanical confinement effects. This virtual type II heterojunction is incorporated adjacent to the active region in a single-quantum-well, ridge-waveguide laser structure. An anomalous "Negative-$T_o$" region is observed in which threshold current decreases with increasing temperature. A reduction in the temperature sensitivity of the threshold current of the laser structure results.

8 Claims, 8 Drawing Sheets

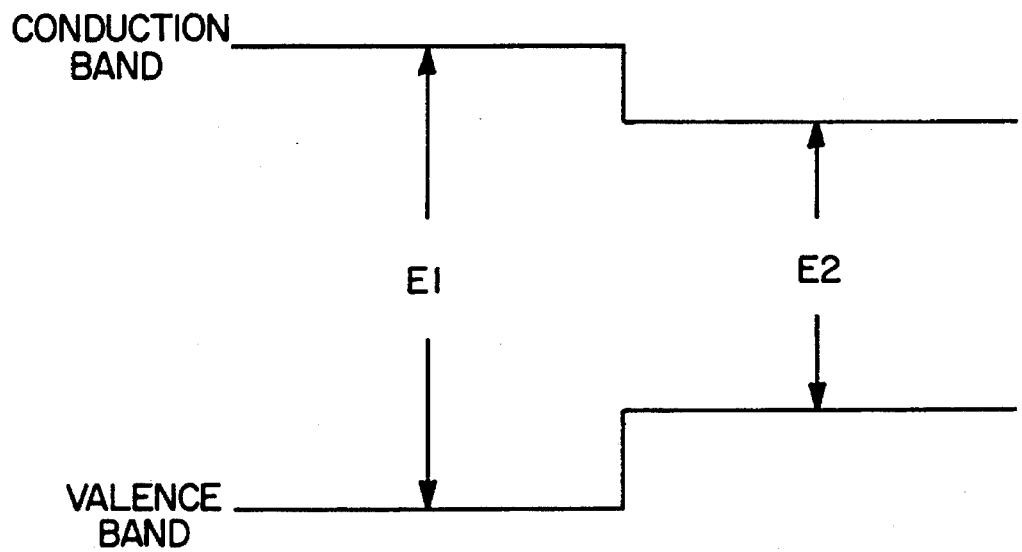
FIG. IA
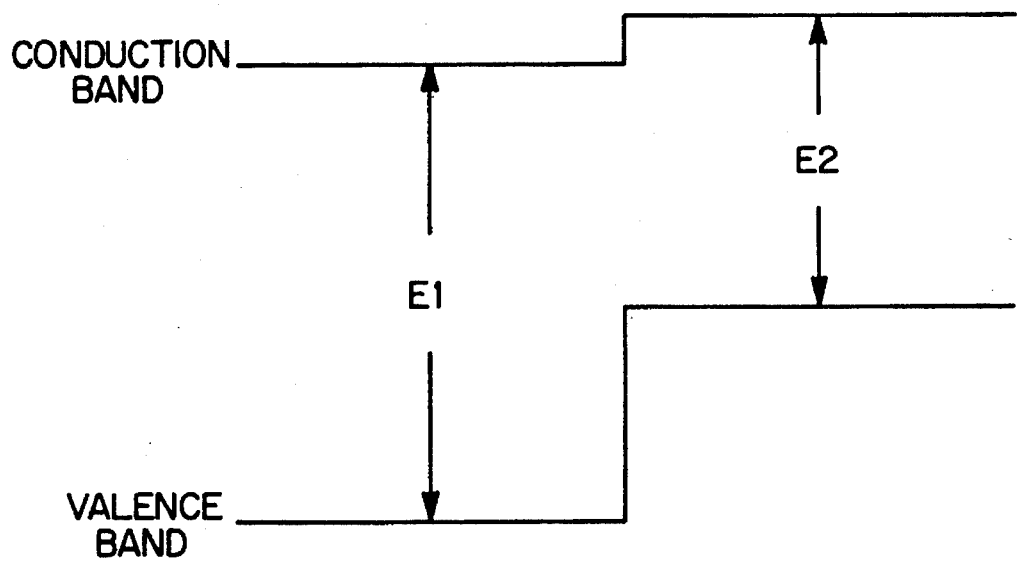
FIG. IB 5,483,547

SEMICONDUCTOR LASER STRUCTURE FOR IMPROVED STABILITY OF THE THRESHOLD CURRENT WITH RESPECT TO CHANGES IN THE AMBIENT TEMPERATURE

FIELD OF THE INVENTION

This invention relates to semiconductor heterojuncture structures and more particularly to such structures having Type II characteristics formed from semiconductor materials which normally form Type I heterojunctions.

BACKGROUND

A compositional heterojunction structure occurs when a semiconductor material having a given bandgap is grown onto a semiconductor material having a different bandgap. If the conduction band minimum and valence band maximum in the narrower bandgap material are aligned or nested within the bandgap of the other material, the heterojunction is Type I. If, however, the conduction band minimum and valance band maximum are staggered the heterojunction is Type II.

Because of a relatively direct transition, the radiative recombination process in Type I or nested heterojunctions is generally more efficient than in Type II heterojunctions. Thus, Type I heterojunctions are preferable in semiconductor devices which are utilized as light sources in optical communication systems. Further, in optical communication systems, the wavelength at which the optical source emits radiation is important, as most optical fibers used in long-distance links have an attenuation minimum at approximately 1.55 μm. For this reason III–V alloys tailored to emit at this wavelength are frequently selected. To achieve this wavelength an alloy based on the InGaAsP/InP system is commonly adopted. This alloy structure is known to yield Type I heterojunctions which from an efficiency standpoint is advantageous. There is, however, an inherent characteristic of Type I heterojunctions which adversely affects efficient operation of lasing devices based on such junctions. This characteristic is the tendency for the threshold current of the laser to increase with temperature, the threshold current density increasing approximately exponentially with temperature. This temperature sensitivity, apart from other limitations on device performance, causes temperature induced chirp or wavelength shift. This wavelength shift in conjunction with the inherent dispersion in an optical fiber limits the bandwidth and/or transmission distance that may be obtained in a long-haul optical transmission system.

As will be discussed in greater detail herein, a Type II heterojunction, appropriately situated with respect to the laser active region, can induce a recombination current which decreases approximately exponentially in relation to increasing temperature. Thus, the combination of a Type I and Type II heterojunction in a semiconductor laser is presented herein as a means to reduce the temperature sensitivity of the operational characteristics.

SUMMARY OF THE INVENTION

It is therefore an object of the present invention to provide a Type II heterojunction using semiconductor materials which normally form Type I heterojunctions.

It is a further object of the present invention to provide a Type II heterojunction using a stack of epitaxial, III–V semiconductor materials which normally form Type I heterojunctions.

It is yet a further object of the invention to provide a semiconductor laser incorporating both a Type I and a Type II heterojunction.

It is still another object of the present invention to provide a semiconductor laser having both Type I and Type II heterojunctions acting in combination to reduce the temperature sensitivity of the operational characteristics.

Therefore, in accordance with a first aspect of the invention there is provided a semiconductor heterojunction structure having Type II characteristics formed of Type I, III–V alloy semiconductor materials. The structure has first, second and third adjoining regions of semiconductor material with the second region positioned between the first and third regions. The material of the first region has a conduction band with an energy level $C_1$ and a valance band with an energy level $V_1$ defining therebetween a bandgap $E_1$. The material of the second region has a conduction band with an effective energy level $C_2$ and a valance band with an effective energy level $V_2$ defining therebetween an effective bandgap $E_2$. The material of the third region has a conduction band with an energy level $C_3$ and a valence band with an energy level $V_3$ defining therebetween an energy gap $E_3$. The relationship between these bandgaps and energy levels is as follows:

$E_3 > E_2$; $E_3 > E_1$; $C_1 < C_2 < C_3$; and $V_1 < V_3 < V_2$.

In accordance with a second aspect of the invention there is provided a method of forming a heterojunction structure having Type II characteristics from Type I semiconductor material. The method comprises growing a first cladding layer of a first semiconductor material on a substrate, the first material having a conduction band with an energy level $C_1$ and a valance band with an energy level $V_1$ defining therebetween a bandgap $E_1$. A layer of a second semiconductor material is next grown on the first cladding layer, the second material having a conduction band with an energy level $C_2$ and a valance band with an energy level $V_2$ defining therebetween a band gap $E_2$. A second cladding layer of a third semiconductor material is grown on the layer of second material. The third material has a conduction band with an energy level $C_3$ and a valence band with an energy level $V_3$ defining therebetween a bandgap $E_3$. The first and second cladding layers are asymmetrical and selected such that effectively:

$E_3 > E_2$; $E_3 > E_1$; $C_1 < C_2 < C_3$ and; $V_1 < V_3 < V_2$.

According to another aspect of the invention there is provided a semiconductor lasing device having a Type I heterojunction and a virtual Type II heterojunction formed by materials which normally form a Type I heterojunction.

According to yet another aspect of this invention there is provided a method of forming a semiconductor lasing device having a Type I heterojunction active region and a Type II heterojunction formed by materials which normally form a Type I heterojunction. The method comprises the steps:

(a) growing an n-type cladding layer on a substrate;

(b) growing a first separate confinement region on the n-type cladding layer;

(c) growing a Type I heterojunction quantum well active region;

(d) growing a second separate confinement region on the quantum well;

(e) growing a superlattice structure on the second separate confinement region such that a Type II heterojunction is formed at the interface with the confinement region and;

(f) growing a p-type cladding layer on the superlattice structure.

DESCRIPTION OF THE DRAWINGS

The invention will now be described in greater detail with reference to the appended drawings wherein:

FIG. 1A is the band structure of a Type I heterojunction;

FIG. 1B is the band structure of a Type II heterojunction;

DETAILED DESCRIPTION OF THE INVENTION

As shown in FIG. 1A a compositional Type I heterojunction comprises a first semiconductor material having a wide bandgap material and a second semiconductor material having a bandgap which is narrow in relation to the first. The potential energy or electron energy of the conduction band of the wide bandgap material is greater than the potential energy of the conduction band of the narrow material. The energy level of the valence band of the wide bandgap material is lower than the energy level of the valence band of the narrow bandgap material. This results in the "nested" arrangement shown in FIG. 1.

A typical compositional Type II heterojunction is illustrated in FIG. 1B. In contrast to the nested arrangement of the Type I heterostructure it will be noted that in the Type II structure the energy level of the conduction band of the narrow bandgap material is greater than the energy level of the conduction band of the wide bandgap material. This gives the staggered effect as illustrated in FIG. 2B.

Generally, the band alignment as between "nested" or "staggered" is dependent on the materials that form the heterojunction. Most III–V alloy systems of interest in relation to semiconductor lasers are Type I as these lead to higher radiative recombination efficiencies. Some alloys such as $Al_xGa_{1-x}As/AlAs$ crossover from Type I to Type II for x>0.26 ("Carrier Dynamics and Recombination Mechanisms in Staggered-Alignment Heterostructures" by Barbara A. Wilson, IEEE Journal of Quantum Electronics, Vol. 24, No. 8, August 1988). The present invention, however, is based on a concept of creating a virtual Type II heterojunction by using a carefully chosen stack of epitaxial semiconductor materials which normally form Type I heterojunctions. More specifically, the invention contemplates the use of the InGaAsP/InP system, within which alloys a Type I heterojunction is normally formed. The Type II heterojunction is achieved by exploiting modifications to the band structure through quantum mechanical confinement effects. It is known that quantum mechanical confinement effects can be exploited to alter the intrinsic band structure of semiconductor materials (e.g., in structures which tightly confine electrons in 1, 2, or 3 dimensions, quantum wells, wires and dots respectively may be obtained).

Figure 2A:
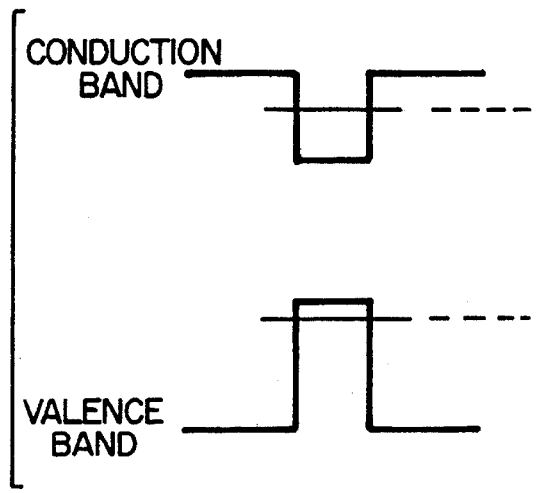
FIG. 2A is the band structure of a quantum well.
Figure 2B:
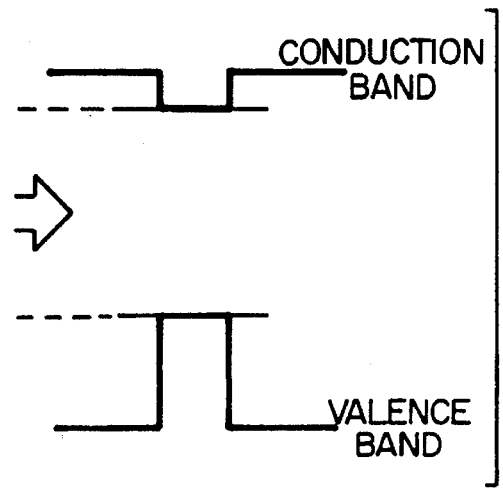
FIG. 2B is the effective band structure resulting from the arrangement of FIG. 2A.

In this regard, FIG. 2A illustrates the band structure of a conventional quantum well (QW). In this system the narrow bandgap material of the QW is nested within the band structure of the symmetrical, wide bandgap material. Also shown in FIG. 2A is the lowest energy conduction and valance sub-band as illustrated by the electron ground state and hole ground state respectively. The effective or equivalent band structure in the quantum well region is depicted in FIG. 2B. The structure of FIG. 2B remains nested or Type I.

Figure 2C:
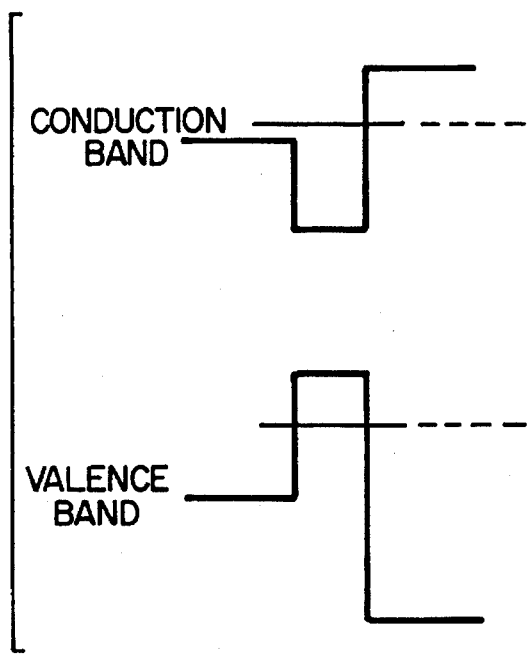
FIG. 2C is the band structure of a quantum well with asymmetrical cladding.
Figure 2D:
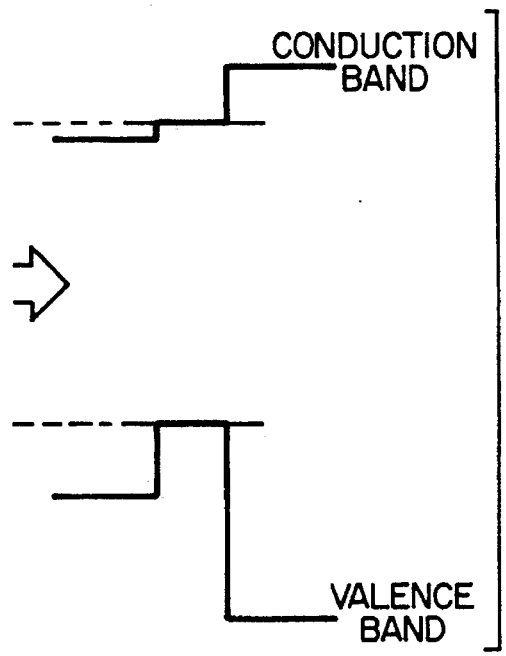
FIG. 2D is the effective band structure resulting from the arrangement of FIG. 2C.

If the band gaps of the materials on either side of the quantum well are not equal, i.e., the well is asymmetrically clad, then there is a range of quantum well thicknesses for which there is no bound electron state. (See, for example, Gaylord et al, J.Appl. Phys., 66, 1989, pp. 1483 and 1842.) In materials such as InGaAsP alloys, which are lattice-matched to InP, quantum wells may be designed for which the electron state is not bound but the hole state is bound. An example of this situation is shown in FIG. 2C. As shown, the energy level of the conduction band of the material to the left of the quantum well is lower than the energy level of the conduction band of the material to the right of the QW. The energy level of the conduction sub-band falls between the energy levels of the conduction bands of the two cladding materials. The effective or equivalent band structure in the vicinity of the quantum well is shown in FIG. 2D. As is apparent from FIG. 2D, the equivalent band structure for the unbound electron ground state in the quantum well forms a virtual Type II heterojunction with the narrow bandgap cladding material.

Figure 3:
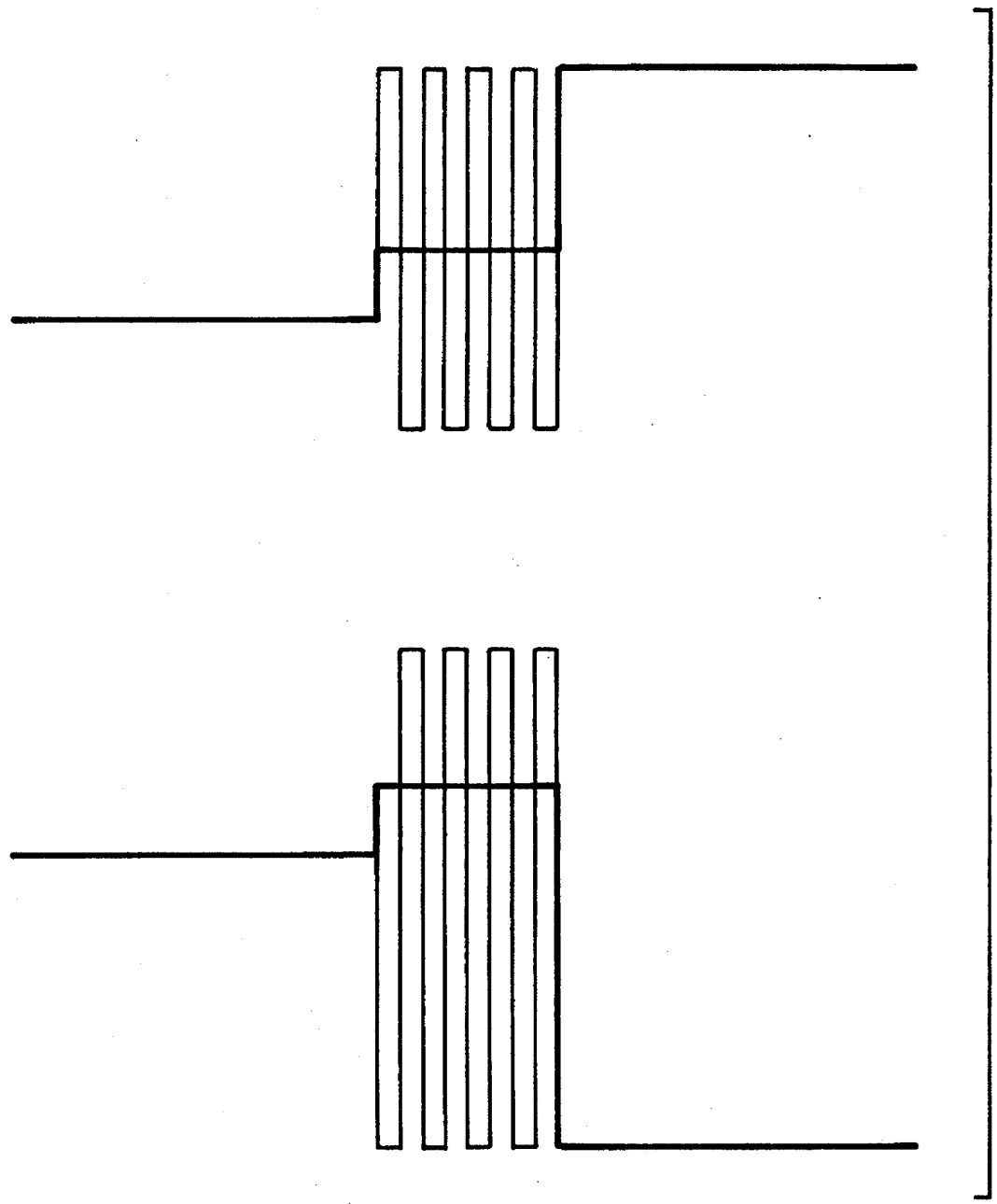
FIG. 3 is a band structure of a superlattice Type II heterojunction.

As an alternate embodiment to the single quantum well (SWQ) of FIGS. 2C and 2D, a virtual Type II heterojunction can be formed by placing a superlattice of Type I quantum wells and barriers between materials with different bandgaps. This embodiment is illustrated in FIG. 3 wherein the equivalent energy level of the conduction band of the superlattice is higher than the energy level of the conduction band of the narrow bandgap cladding material. The valance sub-band, however, remains confined.

Figure 4:
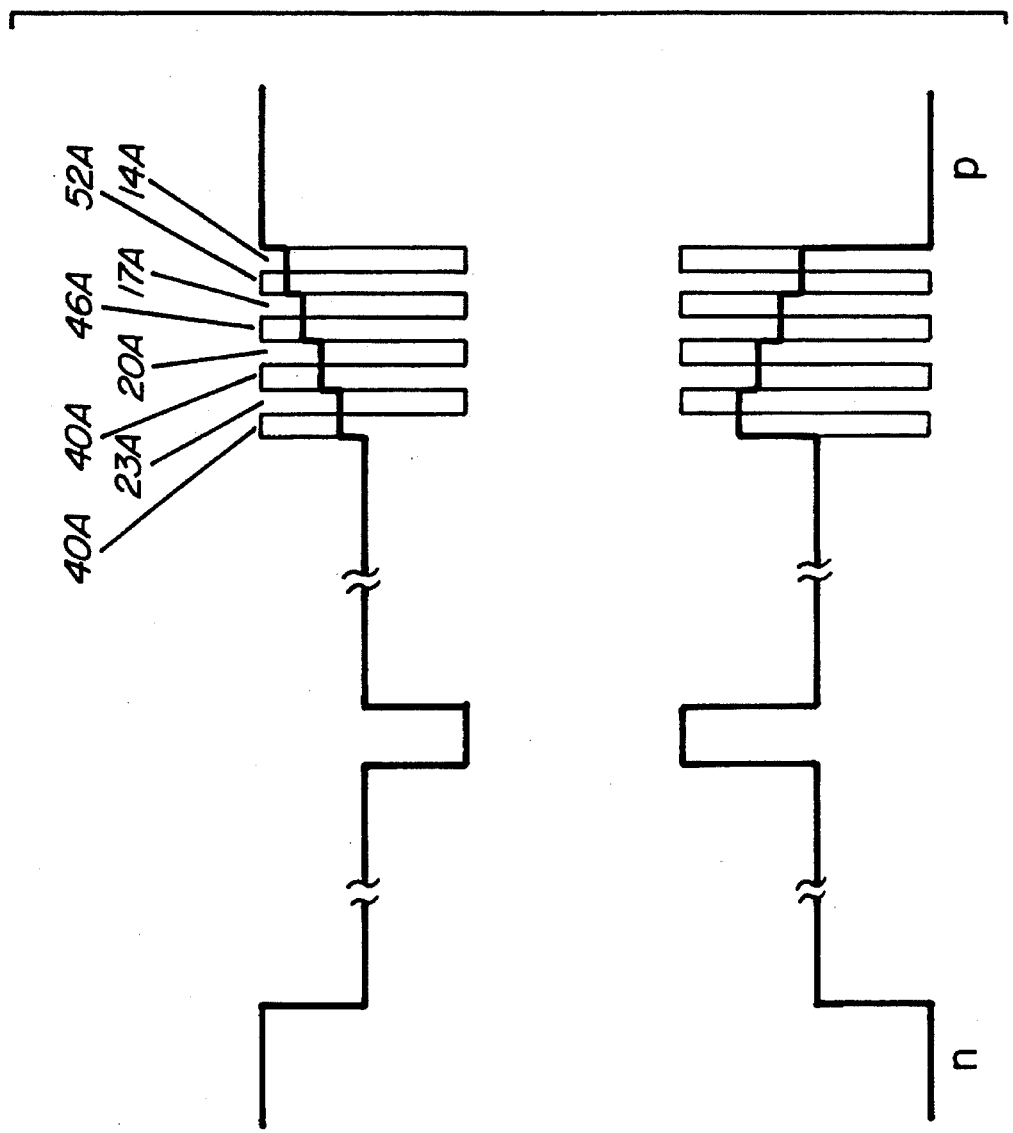
FIG. 4 is a band structure of a semiconductor lasing device incorporating a Type I and a Type II heterojunction.

In accordance with one specific embodiment of the present invention a semiconductor lasing device has been fabricated so as to incorporate both a Type I and a Type II heterojunction. The band structure of this device is illustrated in FIG. 4. In this practical embodiment an InGaAsP/InP alloy system is selected so as to generate light at a wavelength of 1.55 µm. As illustrated, the Type I heterojunction comprises a single quantum well active region at the centre of the separate confinement region. The Type II heterojunction is at the interface of the separate confinement region and the P-doped cladding. The Type II heterojunction is provided by an asymmetrically clad InGaAsP/InP superlattice consisting of four compressively strained quantum wells which decrease in thickness with increasing depth into the InP cladding. It is to be understood that the Type II heterojunction can be formed without strained wells and with as few as one quantum well as previously described or indeed, many more than four wells.

As illustrated in FIG. 4 the thickness of wells decreases while the thickness of the InP barriers increases. The thickness values indicated in FIG. 4 are exemplary only and are not intended to limit the scope of the invention. The stack of epitaxial materials can be grown by known techniques such as MOCVD and MBE. Since such growth techniques are known, further description is not given herein.

Figure 5:
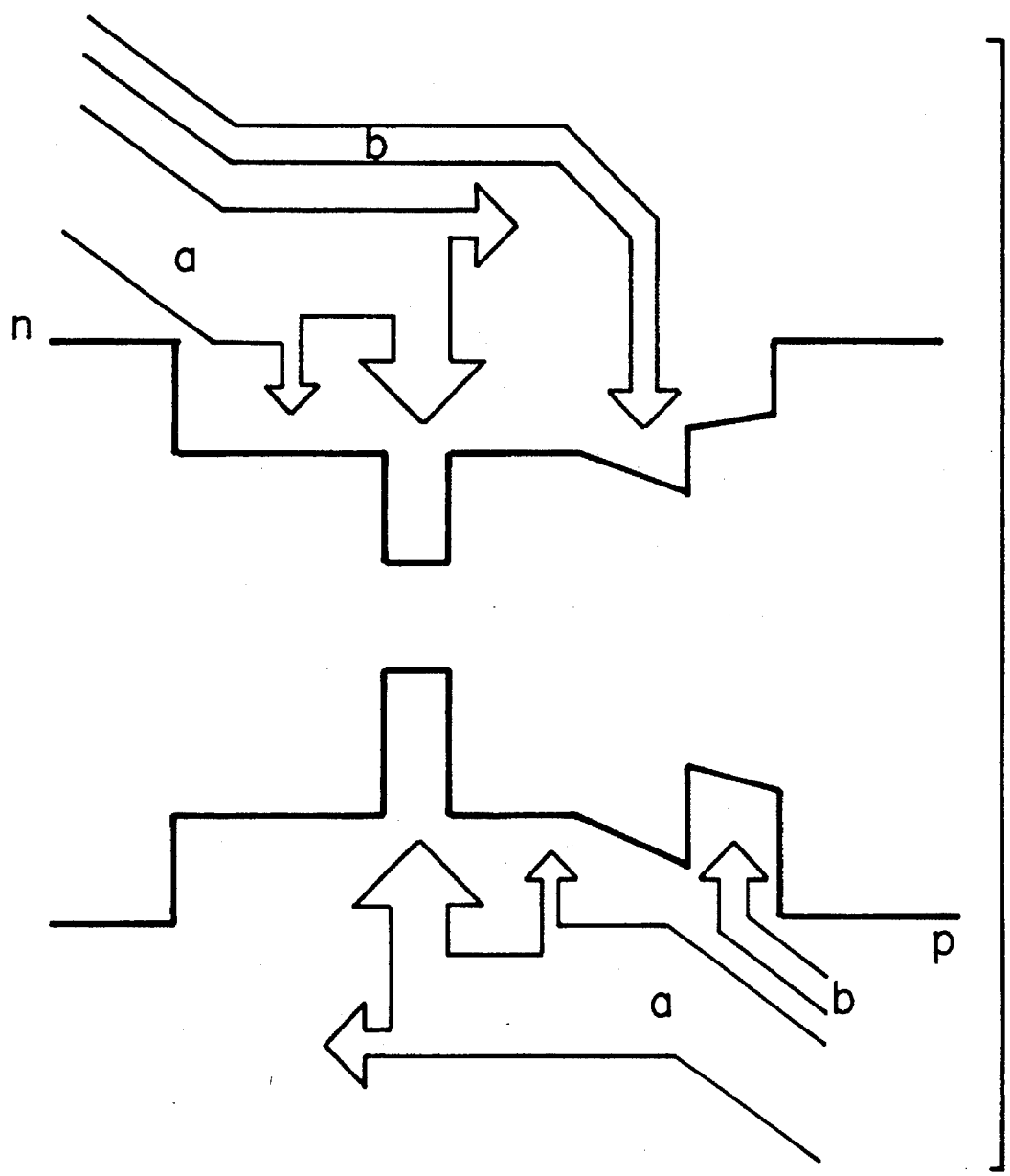
FIG. 5 illustrates the threshold current components to a Type II heterojunction.

In the lasing device according to the invention the threshold current consists of two contributions as depicted in FIG. 5. The first current contribution marked 'a' is due to all non-radiative and spontaneous or stimulated radiative recombination mechanisms in the laser active region. This current increases approximately exponentially with temperature, e.g., $I_{th} = I_O \exp(T/T_O)$ where $I_{th}$ = threshold current $I_O$ = constant T = device absolute temperature and, $T_O = I_{th}/(dI_{th}/dT)$ The second current contribution marked 'b' is due to the recombination of electrons with holes that are trapped in the virtual Type II heterojunction. In contrast to the current contribution marked 'a', this recombination current decreases exponentially as the efficiency of hole escape from the trap improves with increasing temperature.

Figure 6:
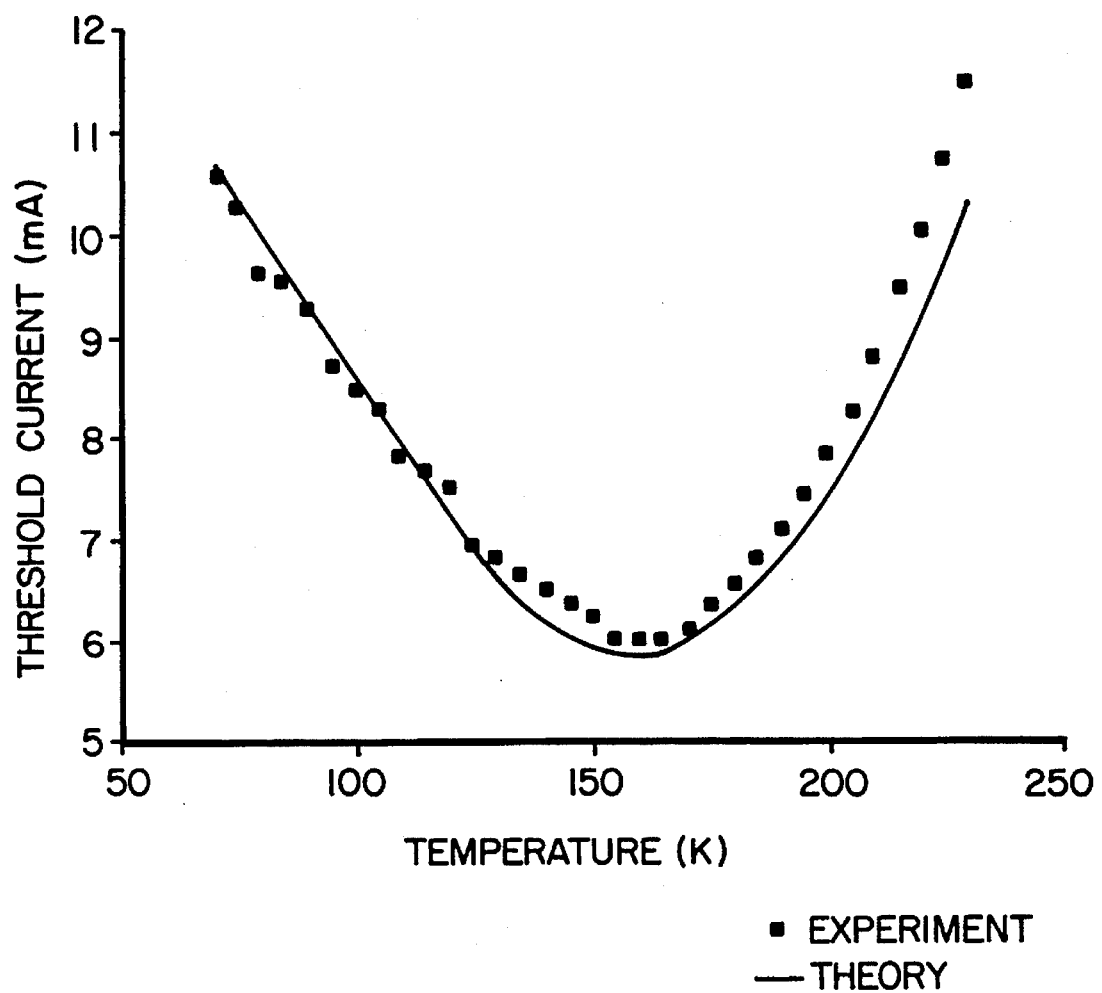
FIG. 6 is a graph of threshold current vs. temperature of the device of FIG. 4.
Figure 7:
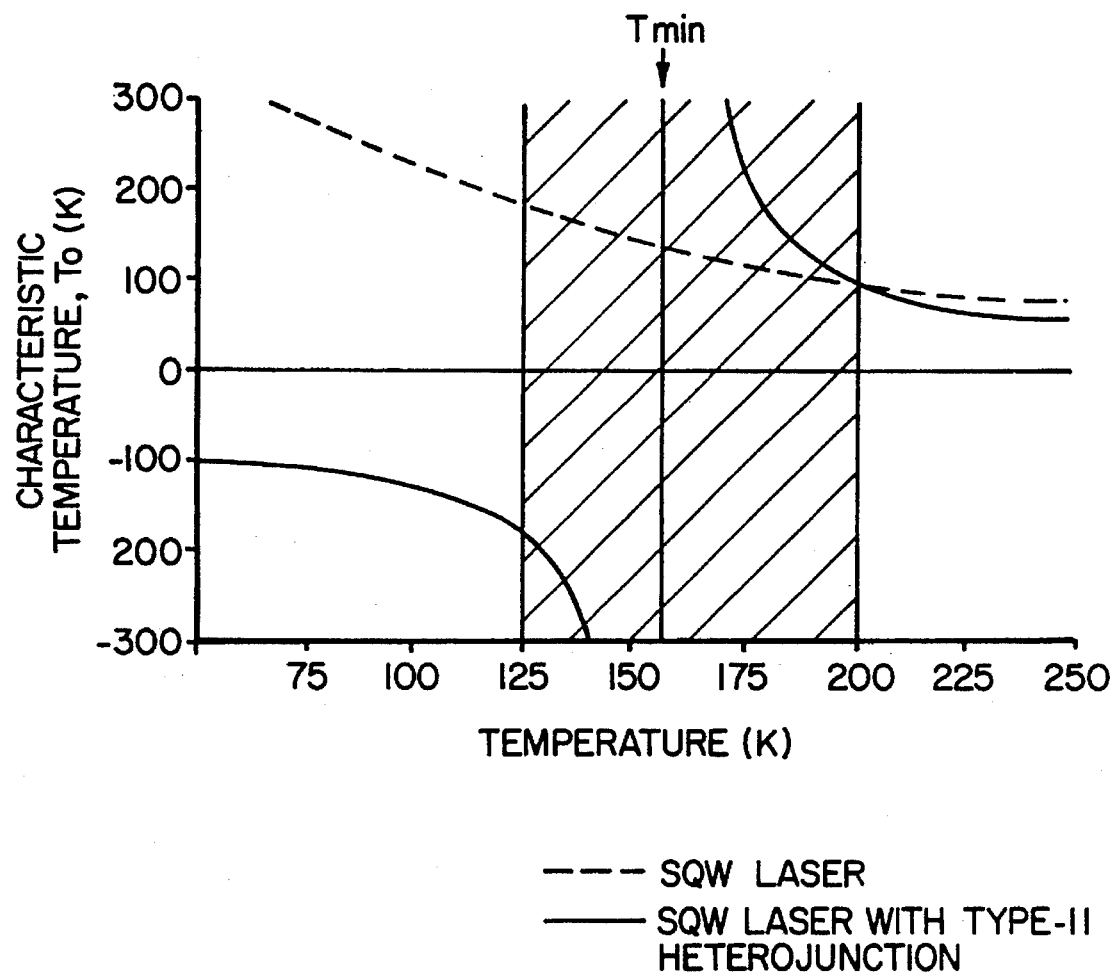
FIG. 7 compares temperature characteristics of devices with and without a Type II heterojunction.

Because the active region current and the recombination current manifest complementary temperature dependencies, the stability of the total injected threshold current with respect to changes in temperature improves over a broad temperature range. FIG. 6 illustrates the relationship between threshold current and temperature for a typical SQW laser having both a Type I and a Type II heterojunction. As shown in FIG. 6 the threshold current initially decreases with increasing temperature attaining a minimum at a temperature between T=150 K. and T=200 K. The threshold current then increases with temperature as shown in FIG. 6. It will be evident from this FIGURE that the experimental data is in excellent agreement with a numerical model. Further, a SQW laser containing a Type II heterojunction exhibits a threshold current temperature stability which is superior to that of a conventional SQW laser without a Type II heterojunction. This is illustrated in FIG. 7 wherein $T_O$ is shown as a function of T with particular emphasis on a 75 K. window around $T_{min}$. This relationship for a typical SQW laser without a virtual Type II heterojunction is also shown for comparison.

Numerical simulation indicates that the Type II heterojunction can be tailored to provide greater temperature stability of the threshold current for InGaAsP lasers at T=300 K. or above.

Figure 8:
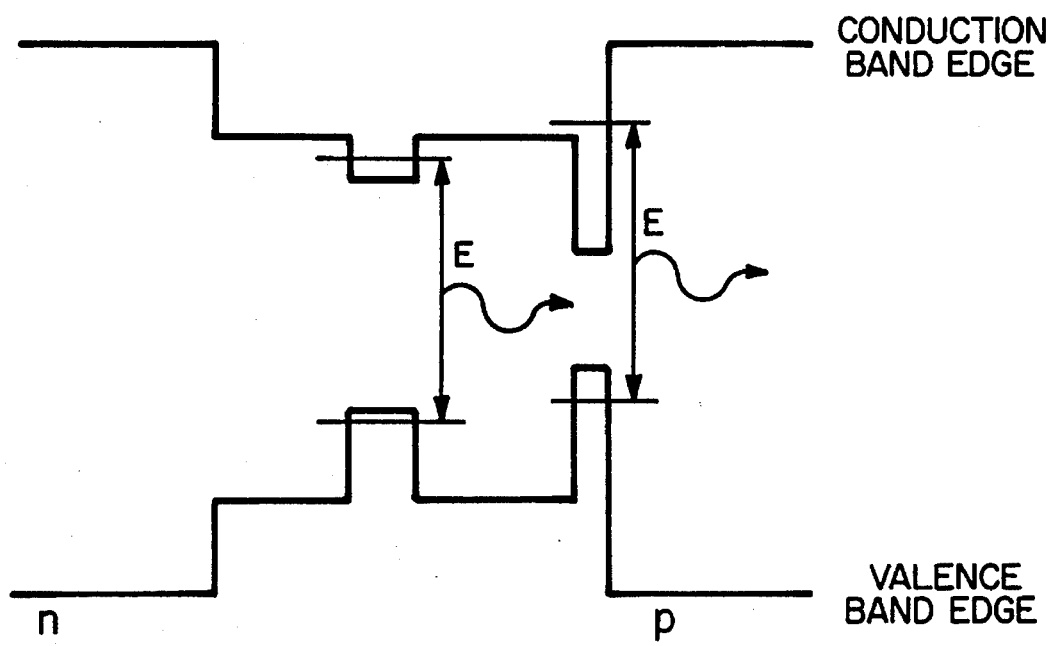
FIG. 8 shows the band structure of an alternate embodiment of the invention.

A further embodiment of the present invention is illustrated in FIG. 8. Conventional Type II heterojunctions are inherently inefficient in terms of output optical power. The virtual Type II heterojunction of the present invention may be designed to emit light at the lasing wavelength. This concept is depicted in FIG. 8. The composition of the device is tailored such that the effective bandgap of Quantum Well #1 (virtual Type II heterojunction) is matched to the bandgap of Quantum Well No. 2 in the active region. Thus, the emission from both quantum wells combine to increase the total optical power.

Although certain specific embodiments of the present invention have been described and illustrated it will be apparent to one skilled in the art that modifications or alterations can be made to the basic concepts. It is to be understood, however, that such modifications or alterations fall within the scope of the invention as more particularly defined by the appended claims.

What is claimed is:

1. A semiconductor lasing device having an active region comprising a first heterojunction structure with a nested bandgap alignment and a second heterojunction structure having a virtual, staggered bandgap alignment, said second heterojunction structure comprising:

first, second and third regions of semiconductor material with said second region said first and third regions;

the material of said first region having a conduction energy level valance band with an energy level $V_1$ defining therebetween a first bandgap $E_1$;

the material of said second region having a conduction band with an effective energy level $C_2$ and a valance band with an effective energy level $V_2$ defining therebetween a second effective bandgap $E_2$ and;

the material of said third region having a conduction band with an energy level $C_3$ and a valance band with an energy level $V_3$ defining therebetween a third bandgap $E_3$;

wherein $E_3 > E_2$;

$E_3 > E_1$;

$C_1 < C_2 < C_3$; and $V_3 < V_1 < V_2$.

2. A semiconductor lasing device as defined in claim 1, said semiconductor material being InGaAsP/InP.

3. A semiconductor lasing device as defined in claim 1, said active region comprising a single quantum well.

4. A semiconductor lasing device as defined in claim 1, said second heterojunction structure comprising a superlattice in said second region.

5. A semiconductor lasing device as defined in claim 4, said superlattice comprising a plurality of quantum wells positioned between barrier regions.

6. A semiconductor lasing device as defined in claim 5, the quantum wells being under compressive strain.

7. A semiconductor lasing device as defined in claim 5, the thickness of each quantum well decreasing incrementally from the first region to the third region.

8. A semiconductor layer as defined in claim 5, the material of the quantum wells being InGaAsP and the material of the barriers being InP.

* * * * *